United States Patent
Pan et al.

[11] Patent Number: 6,159,781
[45] Date of Patent: Dec. 12, 2000

[54] WAY TO FABRICATE THE SELF-ALIGNED T-SHAPE GATE TO REDUCE GATE RESISTIVITY

[75] Inventors: Yang Pan; Erzhuang Liu, both of Singapore, Singapore

[73] Assignee: Chartered Semiconductor Manufacturing, Ltd., Singapore, Singapore

[21] Appl. No.: 09/165,004

[22] Filed: Oct. 1, 1998

[51] Int. Cl.[7] .................................................. H01L 21/338
[52] U.S. Cl. .................................... 438/167; 438/182
[58] Field of Search ............................... 438/167, 182; 148/DIG. 100

[56] References Cited

U.S. PATENT DOCUMENTS

| | | | |
|---|---|---|---|
| 4,599,790 | 7/1986 | Kim et al. | 438/182 |
| 4,700,462 | 10/1987 | Beaubien et al. | 437/187 |
| 4,849,376 | 7/1989 | Balzan et al. | 437/228 |
| 4,889,827 | 12/1989 | Willer | 438/180 |
| 4,929,567 | 5/1990 | Park et al. | 438/182 |
| 4,975,382 | 12/1990 | Takasugi | 437/40 |
| 5,288,654 | 2/1994 | Kasai et al. | 437/41 |
| 5,334,545 | 8/1994 | Caviglia | 438/592 |
| 5,432,126 | 7/1995 | Oikawa | 438/571 |
| 5,496,779 | 3/1996 | Lee et al. | 437/40 |
| 5,498,560 | 3/1996 | Sharma et al. | 437/43 |
| 5,563,079 | 10/1996 | Shin et al. | 438/571 |
| 5,658,826 | 8/1997 | Chung | 438/570 |
| 5,688,704 | 11/1997 | Liu | 437/41 |
| 5,692,560 | 12/1997 | Hattori et al. | 257/473 |
| 5,731,239 | 3/1998 | Wong et al. | 438/296 |
| 5,776,805 | 7/1998 | Kim | 438/182 |
| 5,817,558 | 10/1998 | Wu | 438/291 |

OTHER PUBLICATIONS

IBM Technical Disclosure Bulletin, "Self–Aligned Dummy Gate Sidewall–Spaced MESFET", Dec. 1985, pp. 2767–2768.

IBM Technical Disclosure Bulletin, "Novel Gate Process for 0.1 Micron MOSFETs", Nov. 1993, pp. 455–458.

K. Kurimoto and S. Odanaka, "A T–gate Overlapped LDD Device with High Circuit Performance and High Reliability", IEEE International Electron Devices Meeting 1991, pp. 541–544.

*Primary Examiner*—Richard Elms
*Assistant Examiner*—Christian D. Wilson
*Attorney, Agent, or Firm*—Goerge O. Saile; Rosemary L. S. Pike

[57] ABSTRACT

Disclosed is a method of fabricating a semiconductor field effect transistor, wherein the gate has a short foot portion in contact with the semiconductor substrate for a short gate length and consequent low capacitance, and a large amount of metal in a contact portion for low gate resistance. Salicides are formed on the T-gate source on drain contact areas resulting in large, low resistance contact areas.

23 Claims, 3 Drawing Sheets

WAY TO FABRICATE THE SELF-ALIGNED T-SHAPE GATE TO REDUCE GATE RESISTIVITY

BACKGROUND OF THE INVENTION (1) Field of the Invention

The invention relates to the field of Semiconductor fabrication, and more specifically to a method of fabricating a self-aligned gate for use in semiconductor devices.

(2) Description of the Prior Art

Semiconductor devices are found in nearly all electronic devices. They can be made in miniature forms for use in integrated circuits. The introduction of the transistor and its continuing development in ever-smaller size is one of the major factors in the continued growth of the application of the transistor in a wide range of electronic devices such as personal computers, calculators and many others.

One type of transistor in wide use is the field effect transistor, which is manufactured and used in a number of varieties such as the metal-semiconductor field effect transistor (MESFET).

A controllable current can be established between the source and the drain electrode of this transistor with the current controlled by a voltage applied to a gate electrode that is positioned on the semiconductor substrate between the source and the gate electrode.

The performance of this type of transistor is, like most types of transistors, determined by its size and the therefrom following performance parameters. For the MESFET specifically the gate electrical resistance and capacitance are of importance. Higher capacitance and resistance are, from a performance point of view, undesirable since this reduces the high frequency performance of this transistor.

As the length of the contact surface or gate of the electrode parallel to the direction of current flow is reduced, the resistance of the gate electrode increases and its capacitance decreases. That is, as the gate length is made shorter, its resistance rises and becomes the dominant factor in limiting the operating frequency of the device.

Accordingly, there exists a need for a gate electrode geometry and fabrication that permits the fabrication of smaller gates for the use in field effect transistors and possibly other electronic devices.

In order to increase the operating frequency of a field effect transistor it is therefore in general required that the length of the gate is reduced. Therefore, in order to prevent increase of the gate resistance while shortening the length of the gate, a method in which a section of the gate has a T form is mostly used.

Current design approaches use the T-shaped gate construct to resolve these problems. The process can be implemented largely with individual processing steps that are known within the state of the art and which are fully compatible with related processing steps of field effect transistors and other semiconductor circuit elements.

It is the primary objective of the present invention to increase the quality of the Titanium Silicon layer, which is deposited on top of the drain and source within the construct of the field effect transistor.

Another objective is to allow fabrication of T-gate field effect transistors with very small gate length. As the gate length is reduced to very small values it becomes increasingly more difficult to form acceptable $TiSi_x$ on top of the gate source and drain areas. The present invention addresses this problem.

U.S. Pat. No. 5,498,560 (Sharma et al.) shows a T shaped gate using an opening and spacer process similar to the invention's $1^{st}$ method with the difference that the Sharma does not use a CMP.

U.S. Pat. No. 4,849,376 (Balzan et al.), U.S. Pat. No. 5,688,704 (Liu), U.S. Pat. No. 5,658,826 (Chung), U.S. Pat. No. 5,288,654 (Kasai et al.), U.S. Pat. No. 5,496,779 (Lee et al.), U.S. Pat. No. 4,975,382 (Takasugi), U.S. Pat. No. 4,700,462 (Beaubien) show T shaped gates.

U.S. Pat. No. 5,731,239 (Wong et al.) shows a silicide gate process.

SUMMARY OF THE INVENTION

The present invention is embodied in a multi-step process for fabricating electrodes for semiconductor devices, and particularly for fabricating electrodes for field effect transistors. For a gate length of 0.18 $\mu$m it is difficult to form Titanium Silicon ($TiSi_x$) layers as part of the formation of the field effect transistor. The present invention therefore proposes a method of forming a structure having a narrow contact area with a substrate and an extensive top portion.

Another objective of the present invention is to provide a method of forming a T gate structure that has acceptable resistance and capacitance characteristics within the electronic circuit where the T gate is used.

In accordance with the first embodiment of the present invention, a process for preparing a T gate electrode for use in a semiconductor device, the T gate having a foot in contact with a semiconductor substrate and an extensive head upon the foot and connected with the foot, comprises the steps of providing a semiconductor substrate, forming a Surrounding T-gate Insulator (STI), depositing a dielectric layer overlying the substrate, forming a first trench in the dielectric layer, forming sidewall spacers within the trench, developing a head profile within the spacer and the trench thereby, forming a second trench within the dielectric the T gate now has straight edges, deposit a metal layer overlaying the head profile thereby depositing metal into the foot profile and the head profile, perform Chemical Mechanical Planarization of the deposited metal layer down to the top of the deposited head structure, remove the dielectric layer to form the gate spacer and the T shaped gate, form Lightly Doped Drains around the foot of the T shaped gate using large angle implant to prevent performance degradation of the gate, deposit a layer of Titanium for the formation of $TiS_x$ across the head of the T gate and on top of the T gate and the previously formed T gate spacer forming the salicide.

In accordance with the second embodiment of the present invention, a process for preparing a T-gate electrode for use in a semiconductor device, the T-gate having a foot in contact with a semiconductor substrate and an extensive head upon the foot and connected with the foot, comprises the steps of providing a semiconductor substrate, forming a Surrounding T-gate Insulator (STI), depositing a dielectric layer overlying the substrate, forming a trench within the dielectric layer down to the level of the substrate, forming curved or bow shaped spacers within the trench, developing a head profile within the spacer and the trench where now the foot profile of the T gate has a dual curved profile, deposit a metal layer overlaying the head profile thereby depositing metal into the foot profile and the head profile, perform Chemical Mechanical Planarization of the deposited metal layer down to the top of the deposited head structure, remove the dielectric layer to form the gate spacer and the T shaped gate, form Lightly Doped Drains around the foot of the T shaped gate using large angle implant to prevent performance degradation of the gate, deposit a layer of Titanium for the formation of TiSix across the head of the T gate and on top of the T gate and the previously formed T gate spacer forming the salicide.

The T-gate structure of the present invention permits short contact length between the foot or downward extended central portion of the T, and the surface of the semiconductor substrate. This contact length forms the gate for the field effect transistor. The head or crosspiece contains a larger volume of metal than might otherwise be expected for the short gate length, thereby decreasing the electrical resistance of the T gate electrode.

BRIEF DESCRIPTION OF THE DRAWINGS

FIG. 1 shows the formation of the Surrounding Trench Insulation (STI) and the deposition of a dielectric material.

FIG. 2 shows the etching of a trench in the dielectric material and the deposition of wall spacers.

FIG. 3 shows the etching of the dielectric material to form the T gate profile.

FIG. 4 shows the depositing of the head and foot structure of the T gate.

FIG. 5 shows the etching of the dielectric material around the T gate structure and the formation of gate spacers.

FIG. 6 shows the depositing of salicide.

FIG. 7 shows the formation of the STI and the depositing of the dielectric layer.

FIG. 8 shows the etching of a mushroom shaped trench and the formation of spacers within the trench.

FIG. 9 shows the depositing of the T shaped gate.

FIG. 10 shows the etching of the dielectric layer, the formation of LLD's, the formation of the T gate spacers and the source and drain regions within the structure.

FIG. 11 shows the formation of the salicide.

DETAILED DESCRIPTION OF THE PREFERRED EMBODIMENTS

Reference will now be made to the preferred embodiments of the present invention, an example of which is illustrated in the accompanying drawings.

In fabricating the T-gate electrode on the surface of the semiconductor substrate, the dielectric layer is first deposited overlying the substrate, after this a photo-resist material is deposited overlaying the dielectric material. A line pattern is exposed into the resist layer with a single pass of a focussed electron beam or by any other means, which can define the five dimensions. In this manner the central regions of the exposed volume is highly exposed and the adjacent peripheral regions are significantly less heavily exposed. This gradient of exposure results primarily from natural beam dispersion in the resist material.

The deep, narrow trench that is etched into substrate should have sidewalls that are smooth and slightly tapered. There should be no undercutting of the mask that is used to define the trench width and no irregularities along the sidewalls. Control of the sidewalls of the trench is needed so that the trench can be refilled by CVD without the formation of voids.

Figure 1:
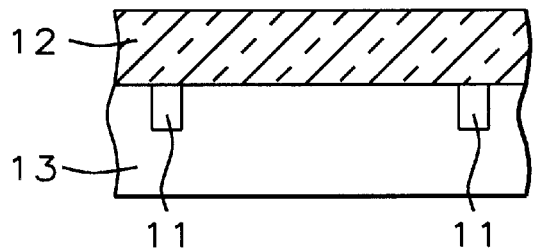
FIGS. 1 through 6 show the first embodiment of the present invention.

FIG. 1 shows the depositing of the dielectric material 12, using standard Chemical Mechanical Depositing techniques, on top of the substrate 13. Prior to the depositing of the dielectric material 12 an insulating trench 11 has been formed within the substrate 13 and around the area where the T gate is to be formed so as to electrically insulate the T gate from the surrounding substrate area.

The line profile of the highly exposed region is developed using standard electron beam resists development procedures, typically wet chemical development. The result is a sharply defined, narrow line profile extending down to the dielectric material. This line profile is transferred to the dielectric layer using dry etching techniques, such as reactive ion etching, which permit transfer of a sharply defined profile rather than a profile that is ragged or diffused due to chemical effects.

Figure 2:
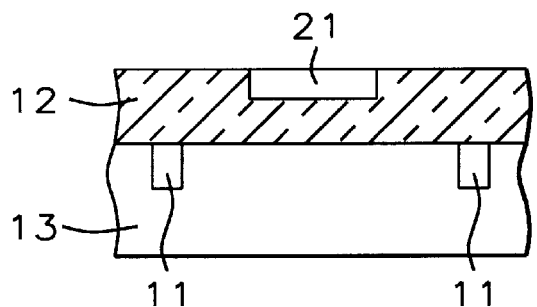

FIG. 2 indicates the etching of the first trench 21 as described above. Nitride sidewall spacers (not shown) are fabricated within the first trench 21 and positioned along the walls of the trench.

In a Lightly Doped Drain (LDD) structure (see below) the drain is formed by two implants. One of these implants is self-aligned to the gate of the electrode; the other implant is self-aligned to the gate electrode on which two oxide sidewall-spacers have been formed. This technique is used within the present invention where the spacer is formed first while the Large-angle-tilt Implanted Drain (LATID) is used to form the LDD's.

A narrower profile for the foot of the T gate is developed in the region of more electron beam exposure in the resist material, using the standard development techniques such as wet chemical development that do not attack the dielectric and the head profile.

Figure 3:
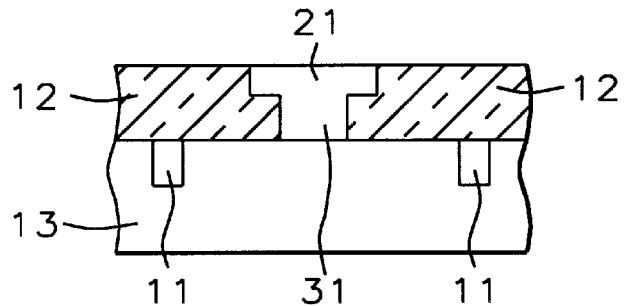

FIG. 3 shows the formation of the foot of the T gate by etching a narrower second trench 31 within trench 21. At this time the nitride wallspacers can be removed.

Figure 4:
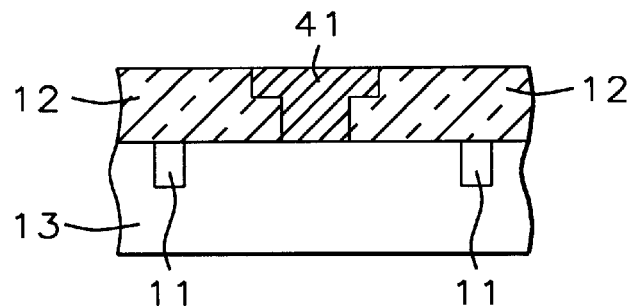

FIG. 4 shows the depositing of a conductive layer 41, which is preferably polysilicon but could also be a metal, over the whole structure and in doing so filling the foot structure 31 and the head structure 21 of the T gate with polysilicon 41. The top layer of the deposited polysilicon 41 is etched away to the level of the top of the head of the T gate using standard Chemical Mechanical Planarization techniques.

Figure 5:
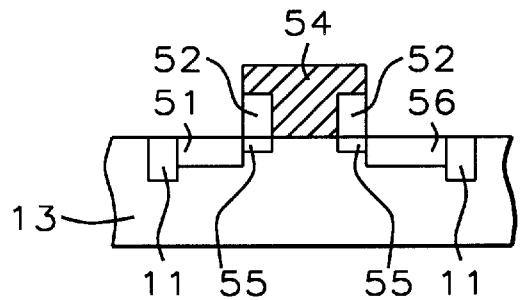

FIG. 5 shows how the oxide 12 is etched away from the sides of the head 54 of the T gate down to the substrate 13 leaving two oxide sidewall spacers 52 around the foot of the T gate. The T-gate 54 with the T gate sidewall spacers 52 are now complete. Large tilt angle implant 55 is used for the formation of the Lightly Doped Drains (LDD's).

It has previously been determined that hot-carrier effects into the gate oxide will cause unacceptable performance degradation in N-type Metal Oxide Semiconductor (NMOS) devices built with conventional drain structures if their channel length is less than 2 um. To overcome this problem, such alternative drain structure as double-diffused drains and lightly doped drains (LDD's) must be used. The purpose of both types of structures is the same that is to absorb some of the potential into the drain. The present invention uses LDD's.

In the LDD structure, the drain 51 is formed by two implants. One of these is self-aligned to the gate electrode 54, and the other is self-aligned to the gate electrode on which two oxide sidewall spacers have been formed (FIG. 2). The purpose of the lighter first dose is to form a lightly doped section of the drain 51 at the edge near the channel. This structure causes the voltage drop between the drain and the source to be shared by the drain and the channel in contrast to the conventional drain structure, in which almost the entire voltage drop occurs across the lightly doped channel region.

The T-gate structure that is the subject of the present invention forms part of the construction of a number of semiconductor devices, for instance the Metal Oxide Semiconductor Field Effect Transistor (MOSFET). This device has a gate terminal (to which the input signal is normally applied), as well as source and drain terminals across which the output voltage is developed, and through which the output current flows, i.e., the drain-source current. The gate terminal is connected to the gate electrode (a conductor) while the remaining terminals are connected to heavily doped source and drain regions in the semiconductor substrate.

A channel region in the semiconductor under the gate electrode separates the source and the drain. The channel is lightly doped with a dopant type opposite to that of the source and the drain. The semiconductor is also physically separated from the gate electrode by an insulating layer (typically SiO2) so that no current flows between the gate electrode and the semiconductor.

In a typical structure an N+ type drain is formed with an N+ type source, the N material is phosphorous or arsenic. An N-type material is typically used for the LDD infusion.

Figure 6:
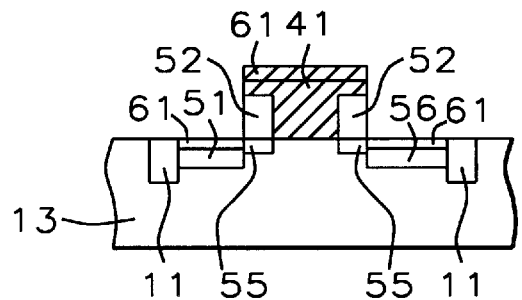
Figure 7:
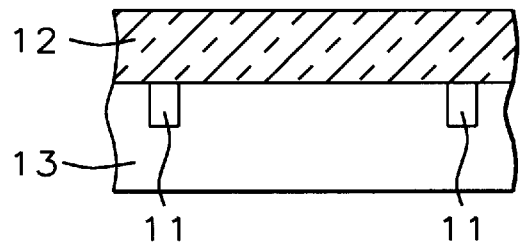
FIGS. 7 through 11 show the second embodiment of the present invention.
Figure 8:
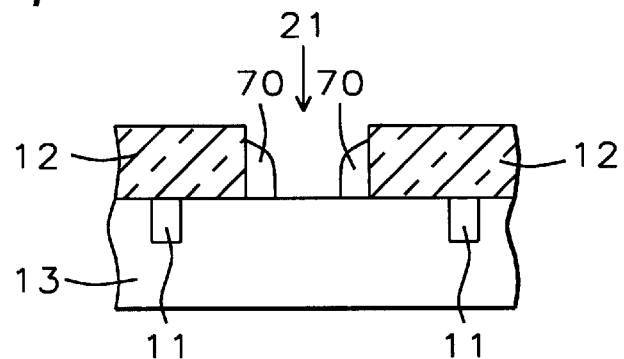
Figure 9:
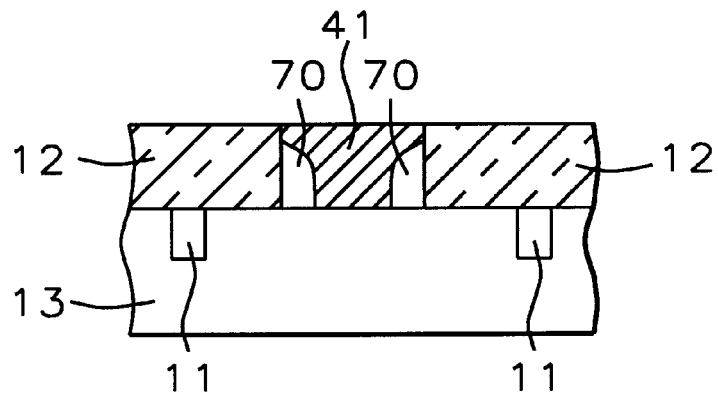
Figure 10:
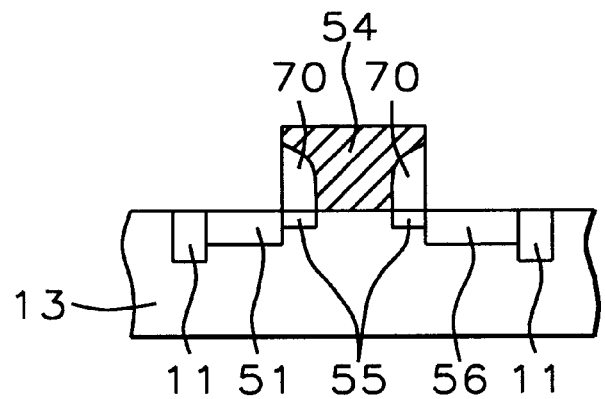
Figure 11:
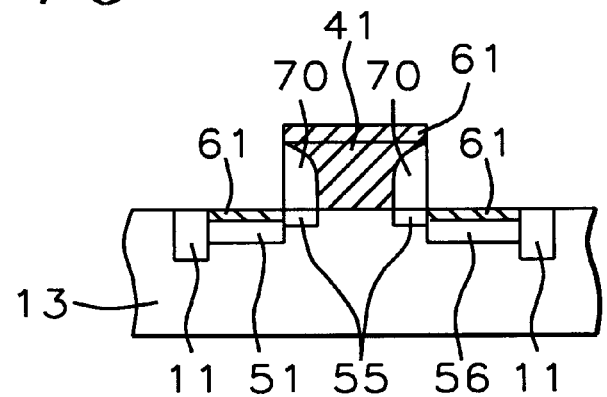

FIG. 6 shows the final step in the processing of the T-gate which is the formation of the salicide 61 that is formed on top of the head of the T-gate 41 and on both the source 51 gate and the drain gate 56.

As transistor dimensions approach 1 um, the conventional contact structures used up to that point began to limit device performance in several ways. First, it was not possible to minimize the contact resistance if the contact hole was also of minimum size and problems of cleaning the contact holes became a concern. In addition, the area of the source a and drain region s could not be minimized because the contact hole had to be aligned to these regions with a separate masking step, and extra area had to be allocated for misalignment. This larger area also resulted in increased source/drain-to-substrate junction capacitance that resulted in slowed down device speed. Also, the technique of using several small, uniform contact holes in stead of one relatively large hole, a technique used to assure simultaneous clearing of the holes during etching, resulted in reduced contact surface which results in in creased contact resistance.

A variety of alternate structures have been investigated in an effort to alleviate the indicated problems. One of structures is the use of self-aligned suicides on the source-drain regions, when these suicides are formed at the time as the polycide structure this approach is referred to as a salicide process. This process is used within the scope of the present invention.

The processing steps for the formation of salicide are well know and within the state of the art of semiconductor device manufacturing. The result of the formation of salicide is that the entire surface of the source and the drain regions become contact structures.

FIGS. 7 through 11 show an alternate method to the process just described. The processing sequence as indicated within these figures is different in that the foot of the T-gate is not a rectangular structure but has side walls 70 which are curved or parabolic in nature as shown in FIG. 18. The remaining processing steps are identical to the processing steps described under FIGS. 1 through 6 and need not to be further detailed at this time.

It will now be clear that the process of the present invention is a significant advancement in the art of the manufacturing of semiconductor devices. Sub-micron gates can be fabricated in gallium arsenide and other semiconductor devices with a sufficient mass of metal in the gate electrode to reduce the resistance of the electrode to acceptable level. The process has a higher yield of successfully fabricating devices than do other techniques, and the T-gate electrodes are well suited to permit increased miniaturization of the devices.

Although the particular embodiment of the present invention has been described in detail for purposes of illustration, modifications may be made without departing from the spirit and scope of the present invention. Accordingly, the invention is not to be limited except as by the appended claims.

What is claimed is:

1. A process for preparing a T-gate structure for use in a semiconductor device, the T gate having a foot in contact with a semiconductor substrate and an enlarged head upon the foot and integral therewith, comprising the steps of:

providing a semiconductor substrate; forming surrounding trench insulation regions within said substrate;

depositing a dielectric layer overlaying said semiconductor and said surrounding trench insulation regions;

etching a first trench within said dielectric layer leaving a dielectric depth of deposition between the bottom of the trench and said substrate which equals the height of the foot of the T-gate;

forming sidewall spacers against the walls of said first trench; etching a second trench through the bottom of said first trench to the level of said substrate and forming a second trench in this manner the width of which equals the width of the foot of the T-gate where the formed second trench is centered with respect to said first trench;

removing said sidewall spacers;

depositing a conductive layer over the structure formed by said dielectric layer, said first trench and said second trench;

performing Chemical Mechanical Planarization (CMP) of said deposited conductive layer down to the level of the top of said dielectric layer;

etching said dielectric layer to the level of the top of said surrounding trench insulation regions along the left hand side of the left wall of said first trench and the right hand side of the right wall of said first trench further using the downward extensions of said left and right wall of said first trench as the line along which the etching process is extended in a downward direction;

forming source and drain within said substrates and on the immediate inside or T-gate side of said surrounding trench insulation regions;

performing large angle lightly doped depositions on the T-gate side of said source and drain; and forming salicide across the top of the T-gate structure and the top of said source and said drain.

2. The process of claim 1, wherein said steps of developing a head profile and developing a foot profile are accomplished by wet chemical procedures.

3. The process of claim 1 wherein said steps of developing a head profile and developing a foot profile are accomplished by electron beam resist techniques.

4. The process of claim 1 wherein said steps of developing a head profile and developing a foot profile are accomplished by dry etching processes using patterned photoresist techniques.

5. The process of claim 1 wherein said dielectric material is selected from the group consisting of silicon dioxides, silicon nitride, and silicon oxynitride.

6. The process of claim 1, wherein said substrate is gallium arsenide.

7. The process of claim 1, wherein said sidewall spacers are formed using nitride.

8. The process of claim 1, wherein polysilicon is used for said conductive layer deposited over said structure formed by said substrate, said first trench and said second trench.

9. The process of claim 1, wherein said surrounding trench insulation is formed using reactive ion etching of said substrate.

10. The process of claim 1, wherein a layer deposited on said substrate which forms an interface between said substrate and a mask for dry etching said surrounding trench insulation regions is formed of a combination layer of thermal oxide, Chemical Vapor Deposition (CVD) silicon nitride, and CVD oxide.

11. A process for preparing a mush-room shaped T-gate structure for use in a semiconductor device, said T gate having a foot in contact with a semiconductor substrate and an enlarged head upon said foot and integral therewith, comprising the steps of:

providing a semiconductor substrate;

forming surrounding trench insulation regions within said substrate;

depositing a dielectric layer overlaying said semiconductor and said surrounding trench insulation regions;

etching a trench within said dielectric layer where the walls of said trench are mushroom shaped;

forming spacers against said walls of said trench;

depositing a conductive layer over said structure formed by said dielectric layer, said first trench and said second trench;

performing Chemical Mechanical Planarization (CMP) of said deposited conductive layer down to the level of the top of said dielectric layer;

etching said dielectric layer to the level of the top of said surrounding trench insulator along the left hand side of the left wall of said trench and the right hand side of the right wall of said trench further using the downward extensions of said left and right wall of said trench as the line along which the etching process is extended in a downward direction;

forming source and drain within said substrates and on the immediate inside or T-gate side of said surrounding trench insulators;

performing large angle lightly doped depositions on said source and drain; and forming salicide across the top of the T-gate structure and the top of said source and said drain.

12. The process of claim 11 wherein said steps of developing a head profile and developing a foot profile are accomplished by wet chemical procedures.

13. The process of claim 11 wherein said steps of developing a head profile and developing a foot profile are accomplished by electron beam resist techniques.

14. The process of claim 11 wherein said steps of developing a head profile and developing a foot profile are accomplished by dry etching processes using patterned photoresist techniques.

15. The process of claim 11 wherein said dielectric material is selected from the group consisting of silicon dioxides, silicon nitride, and silicon oxynitride.

16. The process of claim 8, wherein said substrate is gallium arsenide.

17. The process of claim 11, wherein said sidewall spacers are formed using nitride.

18. The process of claim 11, wherein polysilicon is used for said conductive layer deposited over said structure formed by said substrate, said first trench and said second trench.

19. The process of claim 11, wherein said surrounding trench insulation is formed using reactive ion etching of said substrate.

20. The process of claim 11, wherein a layer deposited on said substrate which forms an interface between the substrate and a mask for dry etching said surrounding trench insulation regions is formed of a combination layer of thermal oxide, Chemical Vapor Deposition (CVD) silicon nitride, and CVD oxide.

21. The process of claim 1, wherein metal is used for said conductive layer.

22. A process of fabricating a MOS device with a self-aligned T-shape gate, comprising the steps of:

providing a semiconductor substrate;

forming a dielectric layer over said semiconductor substrate;

forming a first trench in said dielectric layer, wherein said first trench is formed to a portion of the thickness of said dielectric layer, and wherein an upper portion of said T-shape gate will be formed;

forming sidewall spacers on the walls of said first trench;

forming a second trench through the remainder of said dielectric layer, using said sidewall spacers as a mask;

removing said sidewall spacers;

depositing a conductive layer over said dielectric layer and in said first and second trenches;

removing the conductive layer down to the level of the top of said dielectric layer;

removing said dielectric layer except under said upper portion of said T-shape gate, wherein a spacer is formed of a remainder of said dielectric layer;

forming a source and drain in said substrate, adjacent to said gate spacers; and forming a lightly doped source and drain under said gate spacer by large angle implantation.

23. A process for fabricating a MOS device with a self-aligned T-shape gate, comprising the steps of:

providing a semiconductor substrate;

forming a dielectric layer over said semiconductor substrate;

forming a first trench in said dielectric layer;

forming spacers along sidewalls of said trench;

depositing a conductive layer over said dielectric layer, said spacers and in said trench;

removing the conductive layer down to the level of the top of said dielectric layer;

removing said dielectric layer;

forming a source and drain in said substrate, adjacent to said spacers; and forming a lightly doped source and drain under said spacers by large angle implantation.

* * * * *